(12) United States Patent
Masuda

(10) Patent No.: US 8,598,717 B2
(45) Date of Patent: Dec. 3, 2013

(54) SEMICONDUCTOR DEVICE AND METHOD FOR MANUFACTURING THE SAME

(75) Inventor: Naomi Masuda, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 511 days.

(21) Appl. No.: 12/004,920

(22) Filed: Dec. 21, 2007

(65) Prior Publication Data

US 2009/0026609 A1    Jan. 29, 2009

(30) Foreign Application Priority Data

Dec. 27, 2006  (JP) ................................ 2006-353412
Dec. 28, 2006  (JP) ................................ 2006/355025

(51) Int. Cl.
  *H01L 23/498*  (2006.01)
  *H01L 23/522*  (2006.01)

(52) U.S. Cl.
  USPC .................... 257/777; 257/737; 257/E23.142

(58) Field of Classification Search
  USPC .................... 257/737, 777, E23.142
  See application file for complete search history.

(56) References Cited

U.S. PATENT DOCUMENTS

| | | | |
|---|---|---|---|
| 6,444,576 B1 | 9/2002 | Kong | |
| 6,614,104 B2* | 9/2003 | Farnworth et al. | 257/686 |
| 7,091,592 B2* | 8/2006 | Chen et al. | 257/686 |
| 2005/0167795 A1* | 8/2005 | Higashi | 257/678 |
| 2006/0121690 A1 | 6/2006 | Pogge et al. | |
| 2006/0224793 A1* | 10/2006 | Purlia | 710/62 |
| 2006/0261492 A1* | 11/2006 | Corisis et al. | 257/777 |
| 2006/0267213 A1 | 11/2006 | Ozguz et al. | |
| 2007/0023924 A1* | 2/2007 | Funaki | 257/778 |

FOREIGN PATENT DOCUMENTS

JP       2004335948 A  * 11/2004  .......... H01L 21/3205

* cited by examiner

*Primary Examiner* — Ha Tran T Nguyen
*Assistant Examiner* — Raj R Gupta

(57) ABSTRACT

A semiconductor device includes a semiconductor chip, a connection electrode including a first land electrode electrically coupled with the semiconductor chip, and a through electrode formed on an upper surface of the first land electrode to be electrically coupled with the first land electrode using a stud bump, and a sealing resin, through which the connection electrode passes, for sealing the semiconductor chip.

15 Claims, 18 Drawing Sheets ly employed example 1, the solder ball 18 is
SEMICONDUCTOR DEVICE AND METHOD FOR MANUFACTURING THE SAME

CLAIM OF PRIORITY

This applications claims priority from Japanese patent application No. JP 2006/353412, filed Dec. 27, 2006 which was not published in English.

TECHNICAL FIELD

The invention relates to a semiconductor device and a method for manufacturing the semiconductor device, and particularly, to a semiconductor device used for multiple semiconductor device layering and a method for manufacturing the same.

BACKGROUND OF THE INVENTION

Recently, downsizing of semiconductor devices used for portable electronic devices such as a portable phone, and a nonvolatile recording medium of an IC memory card have been in high demand. Fulfilling this demand requires techniques for efficiently packaging the semiconductor chip. The package-on-package process for layering the packages on which the semiconductor chip is mounted has been developed as an example of one of these techniques.

Each of FIGS. 1A, 1B, 2A and 2B is a sectional view showing the semiconductor device and the package-on-package structure as a generally employed example. FIGS. 1A and 1B, for example, show an exemplary case where a semiconductor chip is mounted on a wiring substrate with a face-up structure through a wire bonding. Meanwhile, FIGS. 2A and 2B show an exemplary case where the semiconductor chip is mounted on the wiring substrate with a face-down structure through a stud bump. Referring to FIG. 1A, a semiconductor chip 12 is mounted on a wiring substrate 10 with a die adhesive material 14. The semiconductor chip 12 and the wiring substrate 10 are electrically coupled via a wire 23. The semiconductor chip 12 is sealed with a sealing resin 16. A land electrode 22 is positioned on the wiring substrate 10 on the side of the semiconductor chip 12. A solder ball 18 is positioned on the wiring substrate 10 on the side away from the semiconductor chip 12 via a land electrode 20. The land electrode 22 and the solder ball 18 are electrically coupled. FIG. 1B is a view showing a semiconductor structure having the semiconductor devices shown in FIG. 1A layered. Referring to FIG. 1B, the solder ball 18 of an upper semiconductor device 24 is connected to the land electrode 22 of a lower semiconductor device 26. In this way, the upper semiconductor device 24 is electrically coupled with the lower semiconductor device 26.

Referring to FIG. 2A, the semiconductor chip 12 is mounted on the wiring substrate 10 using stud bumps 28. An underfill material 30 is filled between the semiconductor chip 12 and the wiring substrate 10. The other structure is the same as the one shown in FIG. 1A. FIG. 2B is a view showing a semiconductor structure formed by layering the semiconductor devices shown in FIG. 2A. The method of layering those semiconductor devices is the same as the case shown in FIG. 1B, and the explanation thereof, thus, will be omitted.

Japanese Patent Application Publication No. JP-A-2000-200800 discloses a technology for forming a via post with a stud bump in a semiconductor wafer electrode, which is used for connecting a semiconductor chip and a solder ball that serves as a packaged terminal in a chip-size-package.

In the generally employed example 1, the solder ball 18 is used as the electrode when the semiconductor devices are layered, and also as the electrode when the semiconductor device is mounted on the motherboard, for example. The semiconductor device may be downsized by reducing the electrode pitch of the solder ball 18. However, the solder ball 18 is spherically or elliptically shaped, and as such requires enough spacing from the adjacent electrode so as to not cause short-circuiting when the solder ball is melted. Over-reduction of the electrode pitch of the solder ball may occur, to the extent that a high-precision mount technique is required to mount the solder ball to the motherboard, and accordingly, high-precision inspection jigs are required in the electric inspection step. Therefore, the electrode pitch of the solder ball is required to be wide, which may hinder the downsizing of the semiconductor device.

SUMMARY OF THE INVENTION

The present invention has been made in view of the above circumstances and provides a semiconductor device and a method for manufacturing the semiconductor device capable of downsizing the semiconductor device, and further downsizing a semiconductor structure formed by stacking multiple semiconductor devices as well as the method for manufacturing the semiconductor structure.

According to an aspect of the present invention, there is provided a semiconductor device which includes a semiconductor chip, a connection electrode formed of a first land electrode electrically coupled with the semiconductor chip, and a through electrode formed on an upper surface of the first land electrode so as to be electrically coupled with the first land electrode using a stud bump, and a sealing resin, through which the connection electrode passes, for sealing the semiconductor chip. According to the invention, the through electrode is formed as the stud bump. This makes it possible to reduce the electrode pitch of the connection electrodes, thus reducing the size of the semiconductor device.

In the aforementioned structure, a second land electrode electrically coupled with the semiconductor chip used for an external connection is provided. The connection electrode may be provided around a periphery of the semiconductor chip, and the second land electrode is provided directly below the semiconductor chip. In the structure, the connection electrodes used for layering the semiconductor devices are positioned around the semiconductor chip. For example, the second land electrode used for mounting onto the motherboard or the electric test is positioned directly below the semiconductor chip. This makes it possible to reduce the pitch of the connection electrodes while maintaining the widened pitch of the second land electrodes. The size of the semiconductor device may be reduced without deteriorating the convenience in the packaging to the mother board or the electric testing.

In the aforementioned structure, an upper surface of the connection electrode may be positioned higher than an upper surface of the sealing resin. The upper and the lower semiconductor devices to be layered into the semiconductor structure may be electrically coupled with greater ease and stability.

The aforementioned structure may be provided with a wiring layer which is formed from a metal film and includes the first land electrode, the second land electrode and a wiring for electrically coupling the first and the second land electrodes. The structure allows the wiring layer to be provided on the same plane. In the case where the semiconductor devices are layered, or the semiconductor device is mounted onto the motherboard, the respective bonding surfaces may be put together reliably.

In the aforementioned structure, the through electrodes formed on the first land electrodes which are adjacent with each other may be placed at different positions in a longitudinal direction of the first land electrode. The structure allows the pitch of the connection electrodes to be reduced. This makes it possible to further reduce the size of the semiconductor device.

In the aforementioned structure, the through electrode may be formed by layering at least two stud bumps. The structure allows the height of the through electrode to be increased without increasing the diameter of the through electrode. The height of the through electrode may be increased without preventing the downsizing of the semiconductor device. In the case where the semiconductor devices are layered, as the height of the connection electrode is increased, the upper and lower semiconductor devices which are layered may be electrically coupled with even greater ease and stability.

In the aforementioned structure, the wiring layer may be positioned below a lower surface of the semiconductor chip which is positioned through a face-down packaging. The structure allows the semiconductor chip and the wiring layer to be electrically coupled below the semiconductor chip. This makes it possible to downsize the semiconductor device.

In the aforementioned structure, a first semiconductor device and a second semiconductor device may be layered by bonding a first connection electrode of the first semiconductor device to a second connection electrode of the second semiconductor device. As the through electrode contained in the connection electrode may be formed with the stud bump, the layered semiconductor devices may be formed into the compact layered semiconductor structure. This makes it possible to downsize the semiconductor device.

In the aforementioned structure, another stud bump may be applied between an upper surface of the first connection electrode and a lower surface of the second connection electrode. The first and the second semiconductor devices to be layered may be electrically coupled with greater ease and stability.

In the aforementioned structure, the first and the second connection electrodes may be bonded through a thermocompression process or a soldering process.

The invention provides a method for manufacturing a semiconductor device including the steps of electrically coupling a semiconductor chip and a first land electrode; forming, on an upper surface of the first land electrode, a through electrode that is electrically coupled with the first land electrode using a stud bump so as to form a connection electrode including the first land electrode and a through electrode; and forming a sealing resin, through which the connection electrode passes for sealing the semiconductor chip. As the through electrode may be formed with the stud bump, the connection electrode may have the narrow electrode pitch. This makes it possible to downsize the semiconductor device.

In the aforementioned structure, producing a wiring layer formed from a metal film may be performed. The wiring layer is formed from the first land electrode, the second land electrode electrically coupled with the semiconductor chip to be used for an external connection, and a wiring for electrically coupling the first and the second land electrodes. As the wiring layer is applied on the same plane, the respective bonding surfaces may be put together reliably when the semiconductor devices are layered or the semiconductor device is mounted on the motherboard. The wiring layer may be collectively produced from a single film, making it possible to form the wiring layer with ease.

In the aforementioned structure, producing the wiring layer formed from the metal film may be accomplished by etching a metal film that is applied to a tape substrate. The resulting structure allows the tape substrate to be formed as the support body, resulting in the thin wiring layer. This makes it possible to downsize the semiconductor device.

In the aforementioned structure, forming the sealing resin may be a step for accomplished by covering an upper portion of the connection electrode with a sheet for molding such that an upper surface of the connection electrode is formed higher than an upper surface of the sealing resin. This makes it possible to electrically couple the upper and the lower semiconductor devices to be layered with greater ease and stability.

In the aforementioned structure, electrically coupling the semiconductor chip and the first land electrode may include face-down packaging of the semiconductor chip. The semiconductor chip and the wiring layer may be electrically coupled below the semiconductor chip, thus downsizing the semiconductor device.

In the aforementioned structure, forming the through electrode with the stud bump may include forming the stud bump to be executed a plurality of times. In the resultant structure, the height of the through electrode may be increased without increasing the diameter thereof. The height of the through electrode may be increased without interfering the downsizing of the semiconductor device. As the connection electrode may be made higher when the semiconductor devices are layered, the upper and the lower semiconductor devices which are layered may be electrically coupled with greater ease and stability.

In the aforementioned structure, bonding a first connection electrode of a first semiconductor device to a second connection electrode of a second semiconductor device may be performed. In this structure, the through electrode contained in the connection electrode may be formed as the stud bump, the layered structure of the semiconductor devices may be made compact. This makes it possible to downsize the semiconductor device.

In the aforementioned structure, bonding the first and the second connection electrodes may include forming another stud bump to one of the positions at an upper surface of the first connection electrode and a lower surface of the second connection electrode. In this structure, the first and the second semiconductor devices to be layered may be electrically coupled with greater ease and stability.

In the aforementioned structure, bonding the first and the second connection electrodes may include bonding through thermocompression or soldering.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention to these embodiments. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 1A:
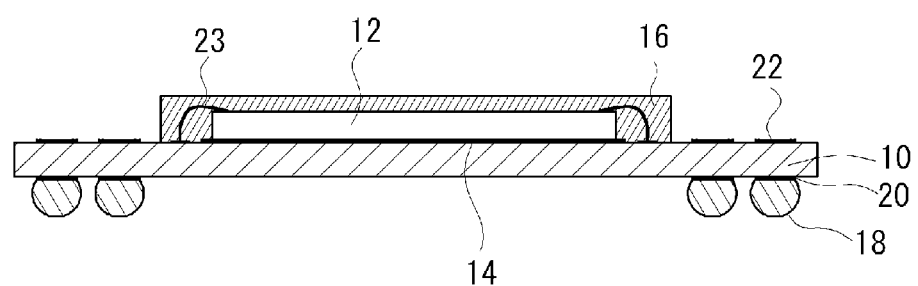
FIG. 1A is a sectional view (example 1) of a semiconductor device according to a generally employed example 1.
Figure 1B:
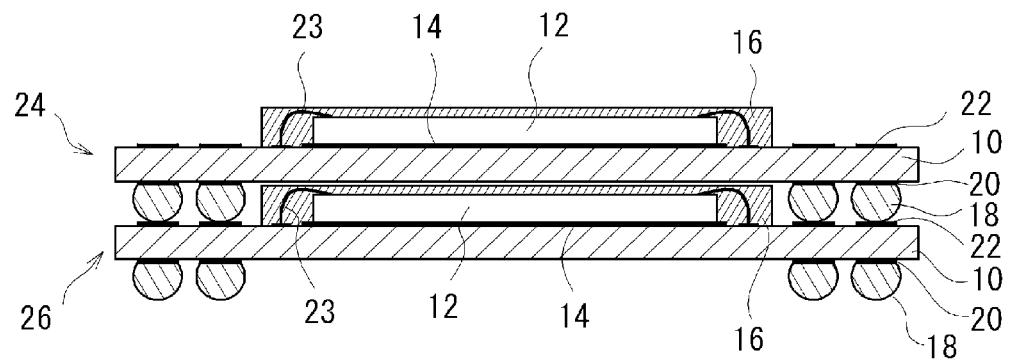
FIG. 1B is a sectional view of the semiconductor devices of FIG. 1A in the package-on-package layered state.
Figure 2A:
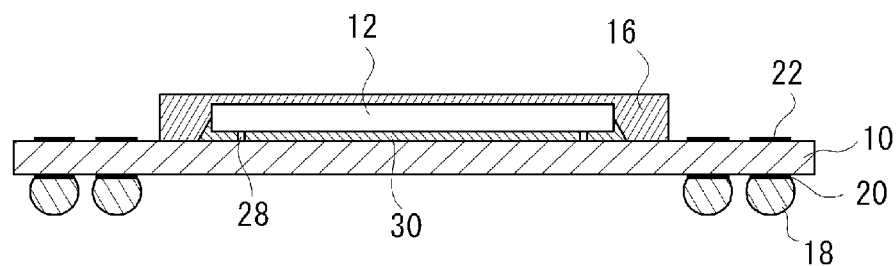
FIG. 2A is a sectional view (example 2) of a semiconductor device according to a generally employed example 1.
Figure 2B:
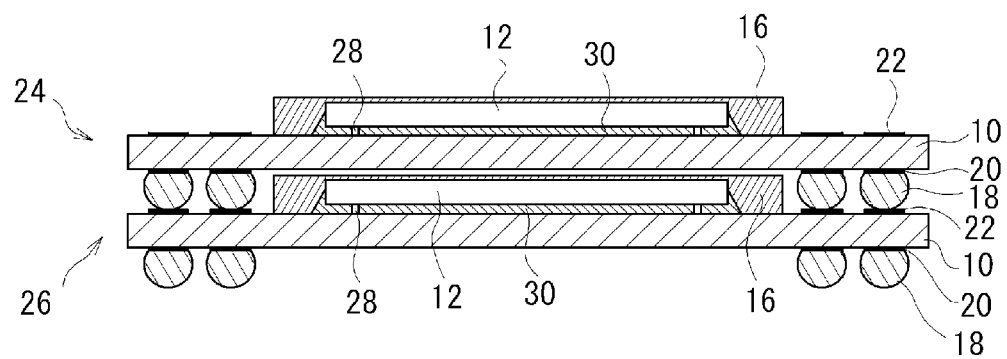
FIG. 2B is a sectional view of the semiconductor devices of FIG. 2A in the package-on-package layered state.
Figure 3:
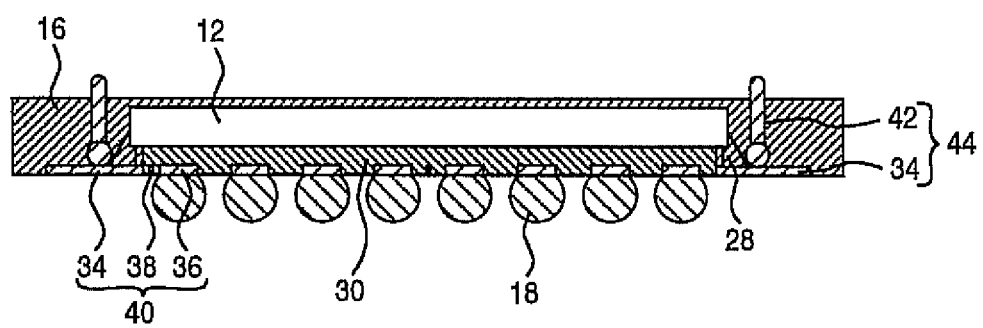
FIG. 3 is a sectional view showing a semiconductor device according to a first embodiment.

FIG. 3 is a sectional view showing a semiconductor device according to the first embodiment. Referring to FIG. 3, a semiconductor chip 12 is mounted at an end of an upper surface of a first land electrode 34 using a stud bump 28 to form a face-down structure through a flip-chip connection. A through electrode 42 is formed at the other end of the upper surface of the first land electrode 34, which serves as a stud bump formed of gold, for example so as to form a connection electrode 44. The first land electrode 34 is an electrode provided for forming the through electrode 42. The connection electrode 44 is used for electrically coupling an upper semiconductor device and a lower semiconductor device to be layered. A wiring layer 40 including the first land electrode 34, a second land electrode 36, and a wiring 38 for connecting the first and the second land electrodes 34 and 36 is formed from a single metal film formed of, for example, copper, and each component of which is electrically coupled with one another. The wiring layer 40 is provided below the lower surface of the semiconductor chip 12, the connection electrode 44 is provided around the semiconductor chip 12, and the second land electrode 36 is provided directly below the semiconductor chip 12. The semiconductor chip 12 and the connection electrode 44 are sealed with a sealing resin 16. The connection electrode 44 passes through the sealing resin 16. An underfill material 30 is filled between the semiconductor chip 12 and the second land electrode 36. The second land electrode 36 is connected to a solder ball 18.

Figure 4A:
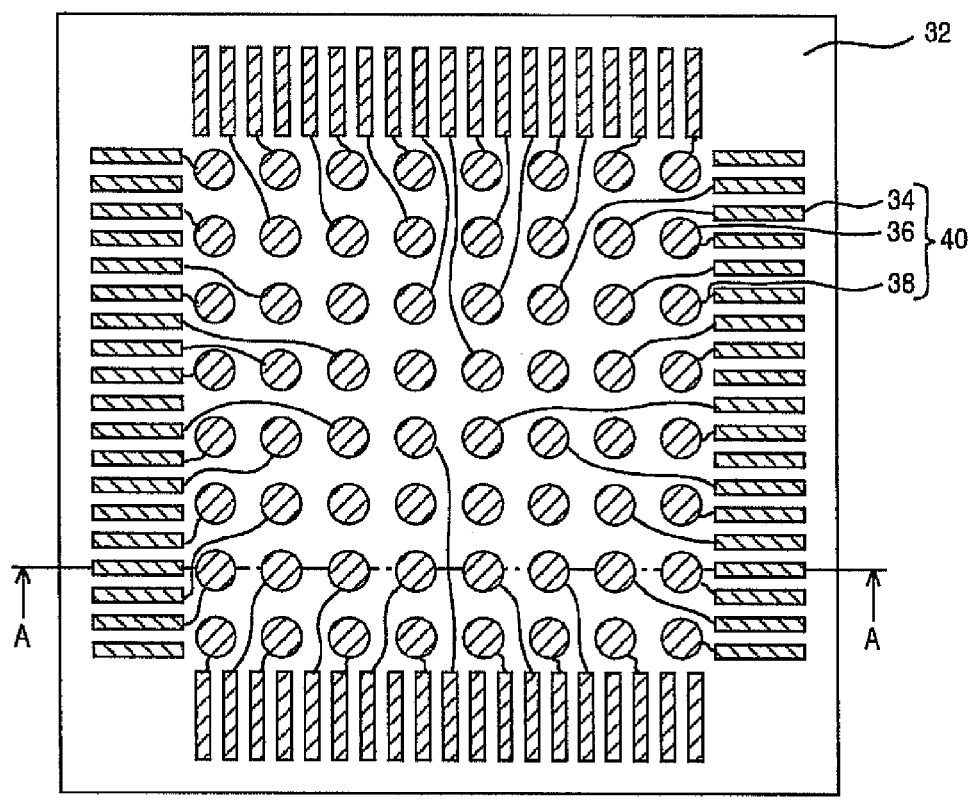
FIG. 4A is a top view (example 1) showing a process of manufacturing the semiconductor device according to the first embodiment.
Figure 4B:
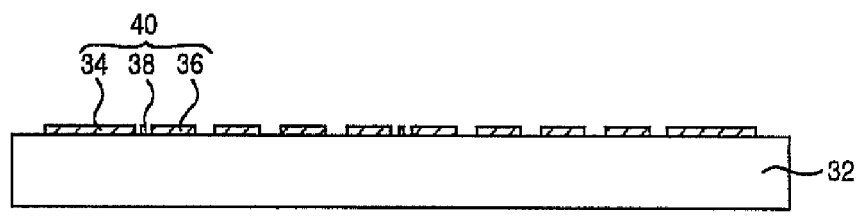
FIG. 4B is a sectional view taken along line A-A shown in FIG. 4A.

A method for manufacturing the semiconductor device according to the first embodiment will be described referring to FIGS. 4A to 9B. Referring to FIG. 4A, a metal film applied to a tape substrate 32 is etched to form the wiring layer 40 formed of such material as copper on the tape substrate 32. The wiring layer 40 includes the first land electrode 34 having the rectangular shape, the second land electrode 36 having the circular shape, and the wiring 38 for electrically coupling the first and the second land electrodes. The tape substrate 32 is used to support the wiring layer 40. The first land electrodes 34 are positioned around the periphery of the tape substrate 32, and the second land electrodes 36 are positioned at the center of the tape substrate 32. The electrode pitch of the first land electrode 34 is set to about 150 μm, and the electrode pitch of the second land electrode 36 is set to about 500 μm. FIG. 4B is a sectional view taken along line A-A shown in FIG. 4A. The thickness of the wiring layer 40 is set to about 30 μm.

Figure 5A:
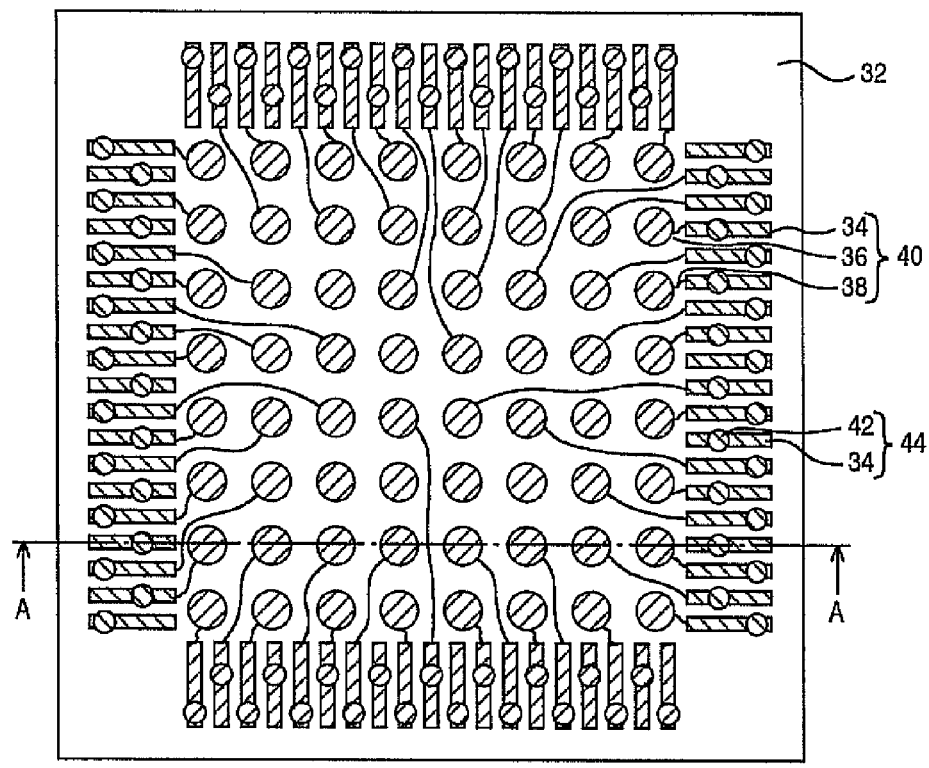
FIG. 5A is a top view (example 2) showing a process of manufacturing the semiconductor device according to the first embodiment.
Figure 5B:
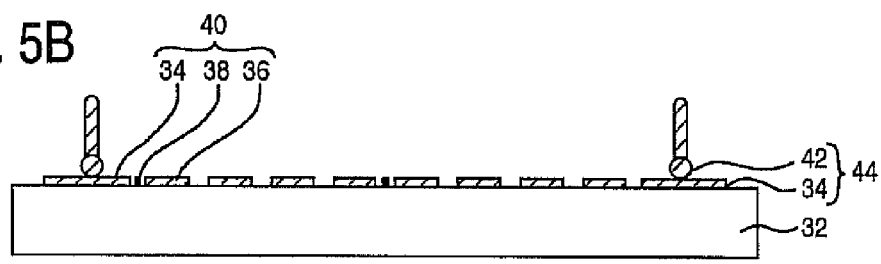
FIG. 5B is a sectional view taken along line A-A shown in FIG. 5A.

FIG. 5A is a top view of the tape substrate 32 having the through electrodes 42 formed on the corresponding first land electrodes 34 as the stud bumps. Referring to FIG. 5A, the through electrode 42 as a gold stud bump is formed on the first land electrode 34. The through electrodes 42 on the adjacent first land electrodes 34 are formed at different positions in the longitudinal direction of the first land electrode 34 so as to form a connection electrode 44 formed of the through electrode 42 and the first land electrode 34. FIG. 5B is a sectional view taken along line A-A shown in FIG. 5A. The height of the through electrode 42 is set to about 230 μm. As the thickness of the first land electrode 34 is set to about 30 μm, the height of the connection electrode 44 is about 260 μm. The diameter of the through electrode 42 is set to about 100 μm.

Figure 6A:
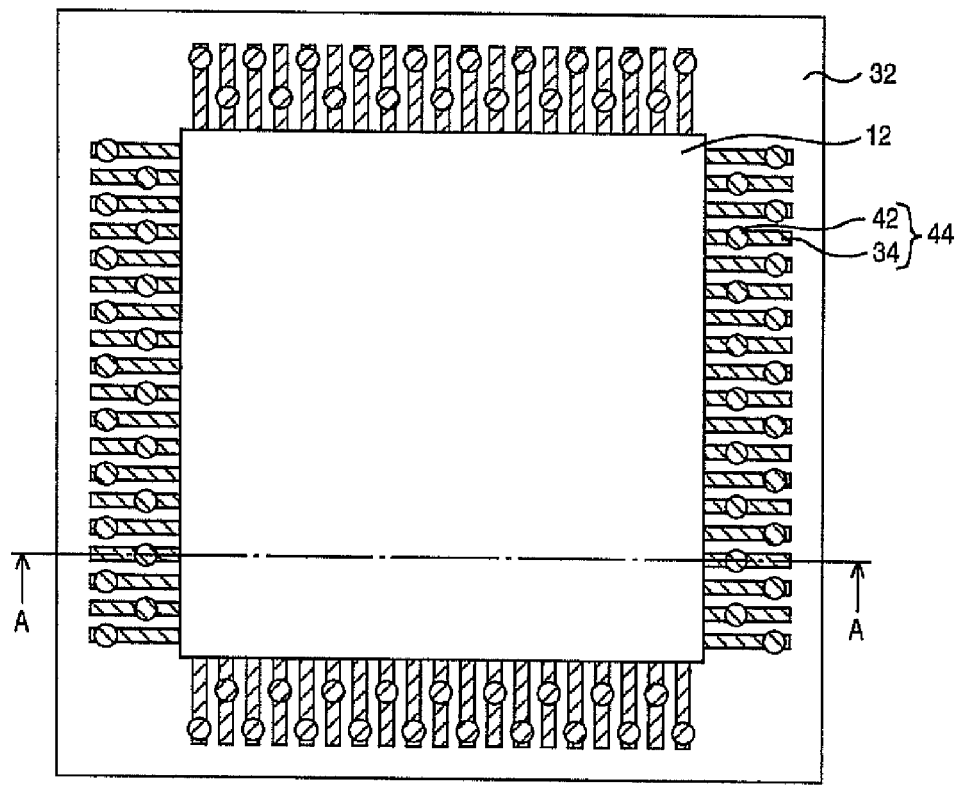
FIG. 6A is a top view (example 3) showing a process of manufacturing the semiconductor device according to the first embodiment.
Figure 6B:
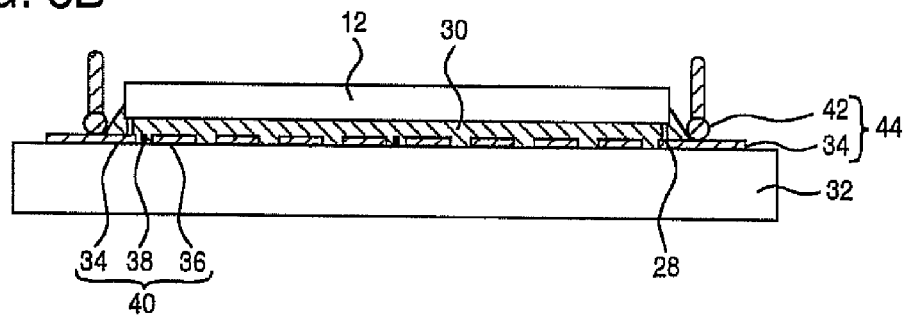
FIG. 6B is a sectional view taken along line A-A shown in FIG. 6A.

FIG. 6A is a top view of the tape substrate 32 on which the semiconductor chip 12 is face-down mounted on the first land electrode 34 with the stud bump 28 through the flip-chip connection. FIG. 6B is a sectional view taken along line A-A shown in FIG. 6A. Referring to FIG. 6B, the semiconductor chip 12 with the thickness of 150 μm is face-down mounted on the upper surface of the first land electrode 34 at one end where the through electrode 42 is not formed with the stud bump 28 through the flip chip connection. The height of the stud bump 28 is about 30 μm. An underfill material 30 formed of an epoxy resin is filled between the semiconductor chip 12 and the tape substrate 32.

Figure 7A:
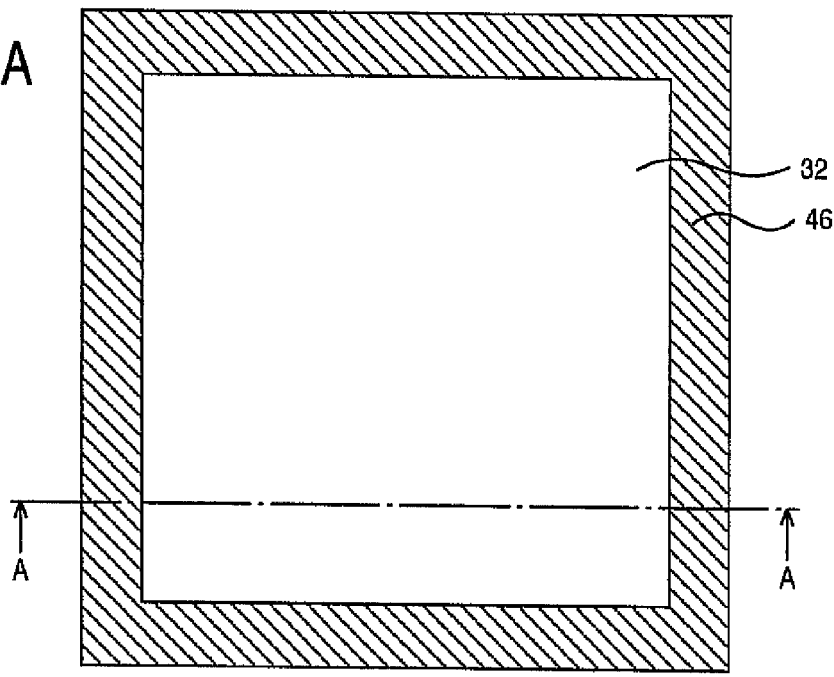
FIG. 7A is a top view (example 4) showing a process of manufacturing the semiconductor device according to the first embodiment.
Figure 7B:
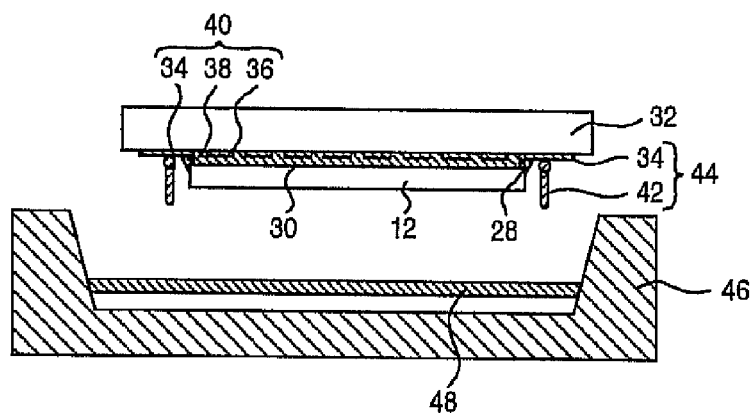
FIGS. 7B and 7C are sectional views each taken along line A-A shown in FIG. 7A.
Figure 7C:
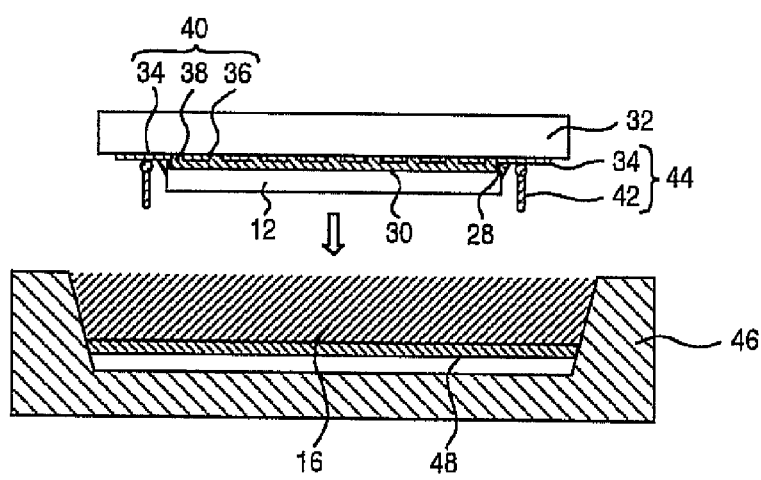

FIG. 7A is a top view showing a state where a mold 46 used for forming the sealing resin 16 is joined with the tape substrate 32. FIGS. 7B and 7C are sectional views taken along line A-A shown in FIG. 7A, respectively. Referring to FIG. 7B, the mold 46 used for forming the sealing resin 16 has a recess, and has a sheet 48 applied on the bottom. The depth from the upper surface of the mold 46 to the sheet 48 is about 250 μm. Referring to FIG. 7C, the mold 46 is filled with the sealing resin 16 which is the thermoset epoxy resin in the uncured state. The mold 46 is then heated so as to abut on the tape substrate 32 in the molten state of the sealing resin 16. At this time, the depth from the upper surface of the mold 46 to the sheet 48 is about 250 μm, and the height of the connection electrode 44 is about 260 μm. The leading end portion of the connection electrode 44 presses the sheet 48 so as to be covered therewith. This makes it possible to seal the semiconductor chip 12 with the sealing resin 16 without sealing the leading end portion of the connection electrode 44 with the sealing resin 16.

Figure 8A:
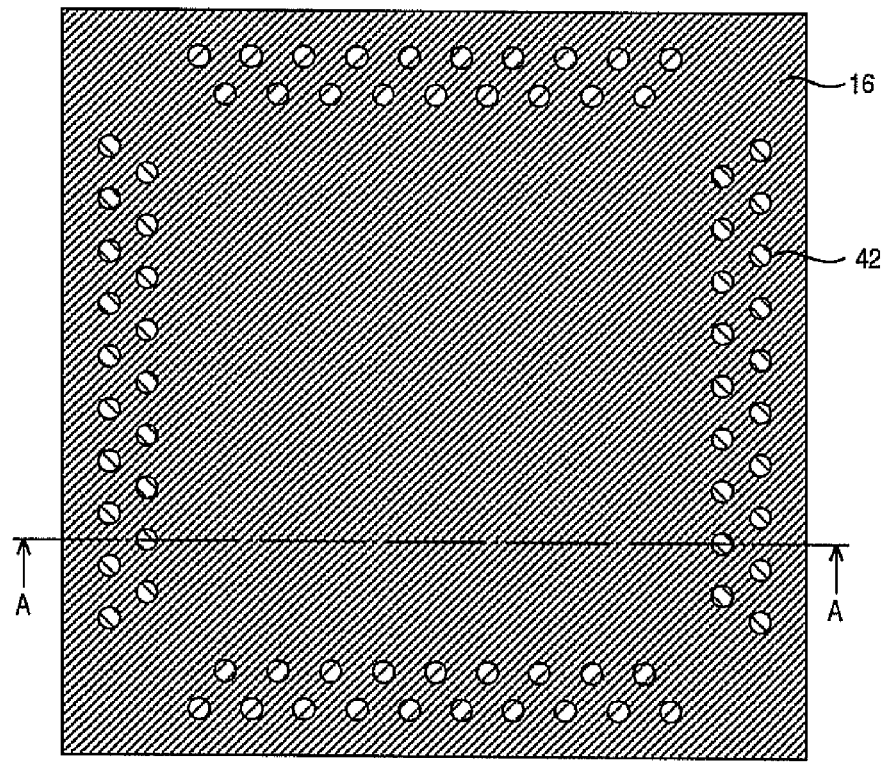
FIG. 8A is a top view (example 5) showing a process of manufacturing the semiconductor device according to the first embodiment.
Figure 8B:
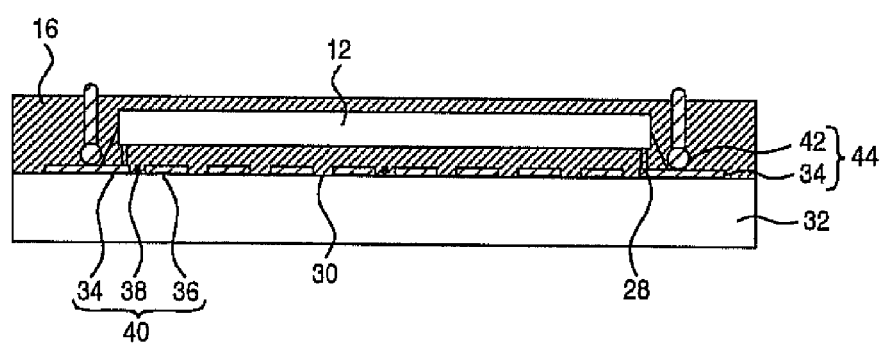
FIG. 8B is a sectional view taken along line A-A shown in FIG. 8A.

FIG. 8A is a top view of the tape substrate 32 after the sealing resin 16 is formed thereon. FIG. 8B is a sectional view taken along line A-A shown in FIG. 8A. Referring to FIG. 8B, upon removal of the mold 46 for forming the sealing resin 16, the semiconductor chip 12 and the connection electrode 44 except the leading end portion thereof are sealed with the sealing resin 16. In other words, the connection electrode 44 passes through the sealing resin 16. The height of the leading end portion of the connection electrode 44 which is not sealed with the sealing resin 16 is about 10 μm.

Figure 9A:
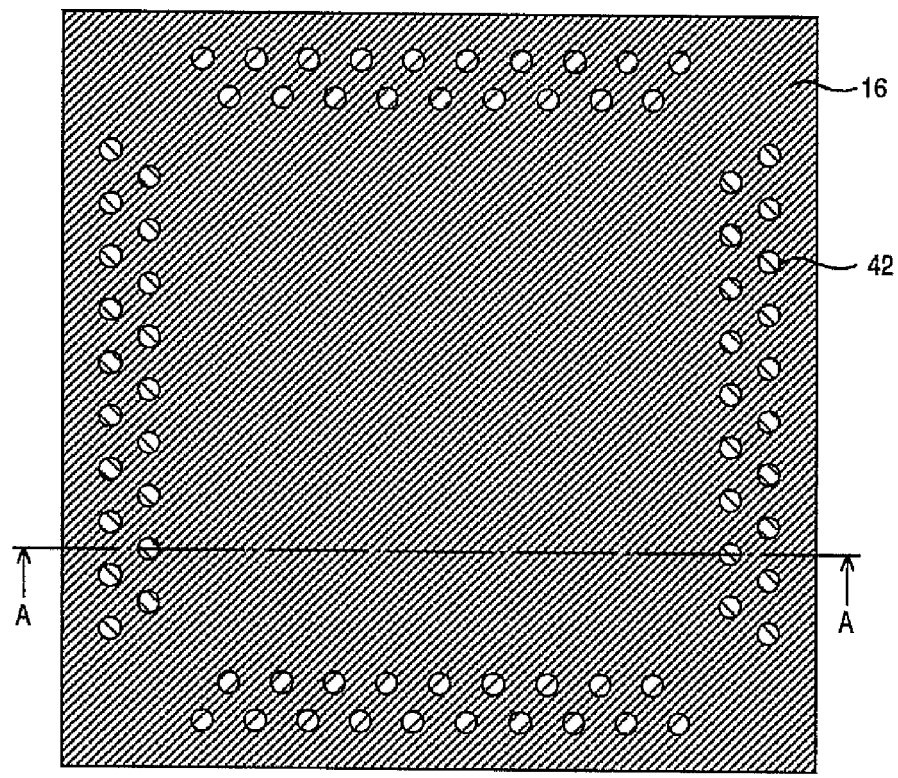
FIG. 9A is a top view (example 6) showing a process of manufacturing the semiconductor device according to the first embodiment.
Figure 9B:
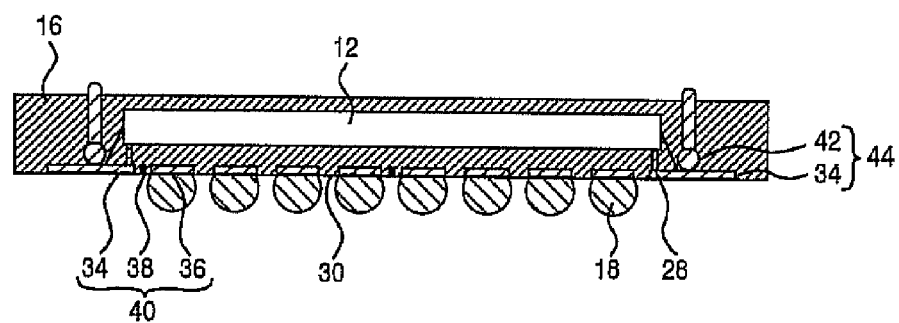
FIG. 9B is a sectional view taken along line A-A shown in FIG. 9A.

FIG. 9A is a top view showing the state where the solder balls 18 are formed on the second land electrodes 36 after the tape substrate 32 is removed. FIG. 9B is a sectional view taken along line A-A shown in FIG. 9A. Referring to FIG. 9B, the solder ball 18 is formed on the second land electrode 36 exposed after the tape substrate 32 is removed. The diameter of the solder ball 18 is about 300 μm. Thus, the semiconductor device as shown in FIG. 3 is produced.

According to the first embodiment, the connection electrode 44 is provided around the semiconductor chip 12 as shown in FIG. 3. In the generally employed example 1, the solder balls 18 are provided around the semiconductor chip 12. The solder ball 18 in the generally employed example 1 may be used for layering the semiconductor devices, mounting the semiconductor devices onto the motherboard, or conducting the electric test. Meanwhile, the connection electrode 44 in the first embodiment is used only for layering the semiconductor devices, and is not used for mounting the semiconductor devices onto the motherboard or conducting the electric test thereof. The convenience of the connection electrode 44 in view of the use for mounting or electric test does not have to be considered. This makes it possible to reduce the electrode pitch of the connection electrodes 44, and further to reduce the diameter of the through electrode 42 compared with that of the solder ball 18 as the through electrode 42 of the connection electrode 44 is formed with the stud bump. The resultant electrode pitch of the connection electrode 44 may be made narrower than the electrode pitch of the solder ball 18. As a result, the semiconductor device according to the first embodiment may be made more compact compared with the semiconductor device of the generally employed example 1.

Referring to FIG. 3, the solder ball 18 is formed on the second land electrode 36. The solder ball 18 may be used for mounting onto the motherboard, and the second land electrode 36 before the solder ball 18 is provided is used for conducting the electric test of the semiconductor device. As the solder ball 18 or the second land electrode 36 is formed directly below the semiconductor chip 12, the size of the semiconductor device does not become large, even if the electrode pitch of the solder ball 18 or the second land electrode 36 is increased. This makes it possible to produce the semiconductor device which does not interfere with the convenience for mounting onto the motherboard and conducting the electric test while keeping the semiconductor device compact.

Referring to FIG. 4A, the wiring layer 40 including the first land electrode 34, the second land electrode 36 and the wiring 38 for electrically coupling the first and the second land electrodes 34 and 36 is formed from a single film having the tape substrate as a support. This makes it possible to form the thin wiring layer 40 with ease, resulting in further downsizing of the semiconductor device.

Referring to FIG. 5A, the through electrodes 42 formed on the adjacent first land electrodes 34 with the stud bumps are provided at the different positions in the longitudinal direction of the first land electrode 34. This makes it possible to further reduce the electrode pitch of the connection electrode 44, thus allowing the semiconductor device to be more compact.

Figure 10:
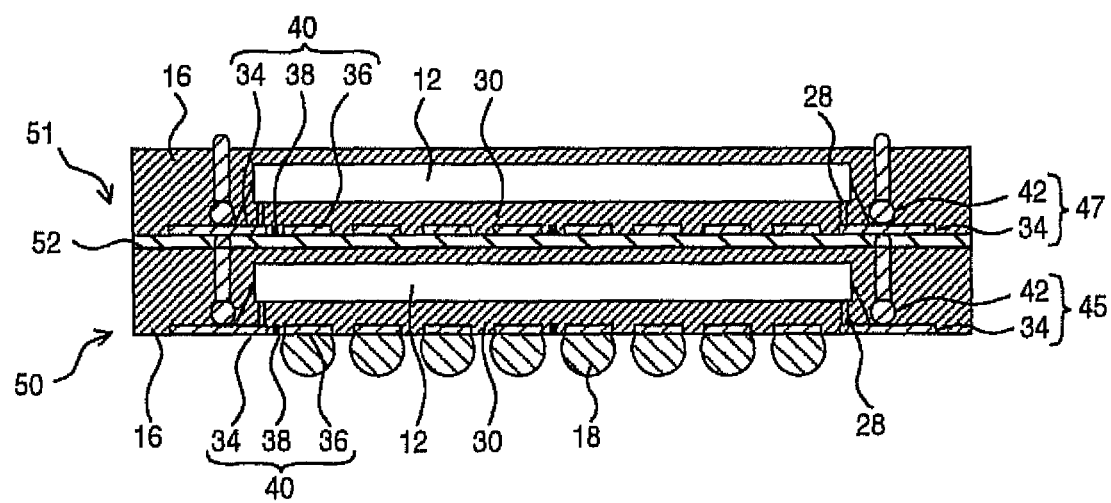
FIG. 10 is a sectional view showing a layered semiconductor structure according to a second embodiment.

A second embodiment is an example of layering the semiconductor devices according to the first embodiment. FIG. 10 is a sectional view of the layered semiconductor structure according to the second embodiment. Referring to FIG. 10, a first semiconductor device 50 and a second semiconductor device 51 are bonded into a layered structure by applying the thermocompression between an upper surface of a first connection electrode 45 of the first semiconductor device 50 and a lower surface of a second connection electrode 47 of the second semiconductor device 51. The solder balls 18 are provided on the first semiconductor device 50, but not provided on the second semiconductor device 51. An adhesive agent 52 is applied between the first and the second semiconductor devices 50 and 51 for ensuring the bonding strength. Thus, the layered semiconductor structure according to the second embodiment is produced.

Referring to FIGS. 4A and 4B, in the semiconductor device according to the first embodiment, the wiring layer 40 is formed by etching the metal film that is applied to the tape substrate 32. The wiring layer 40, thus, is formed on the same plane. The bonding surfaces of the wiring layer 40 may be accurately joined when the semiconductor devices are layered, or the semiconductor device is mounted on the mother board, for example. The wiring layer 40 may be collectively formed by etching the metal film, resulting in easy production.

Referring to FIGS. 7A to 7C, the mold 46 provided with the sheet 48 is used when the sealing resin 16 is formed in the semiconductor device according to the first embodiment. The resultant semiconductor device has the leading end portion of the connection electrode 44 slightly protruding from the upper surface of the sealing resin 16. The amount of the protrusion of the connection electrode 44 is smaller than that of the solder ball 18 used for connecting the upper and the lower semiconductor devices 24 and 26 in the generally employed example 1. This makes it possible to prevent the size of the layered semiconductor structure from increasing, thus realizing the compact layered semiconductor structure. In the second embodiment, the first and the second semiconductor devices 50 and 51 are layered by bonding the first and the second connection electrodes 45 and 47. This makes it possible to perform the electric coupling between the first and the second semiconductor devices 50 and 51 with ease and stability.

In the semiconductor device according to the first embodiment, the second land electrode 36 is used for conducting the electric test of the semiconductor device. This makes it possible to conduct the electric test of individual semiconductor devices before they are layered to form the layered semiconductor structure. As it is possible to identify the defective product among the individual semiconductor devices before they are layered, the yield may be improved and the waste of the member may be avoided.

Because the stud bump is used for layering the semiconductor devices, the flip chip connection technology can be employed, resulting in easy layering.

Figure 11:
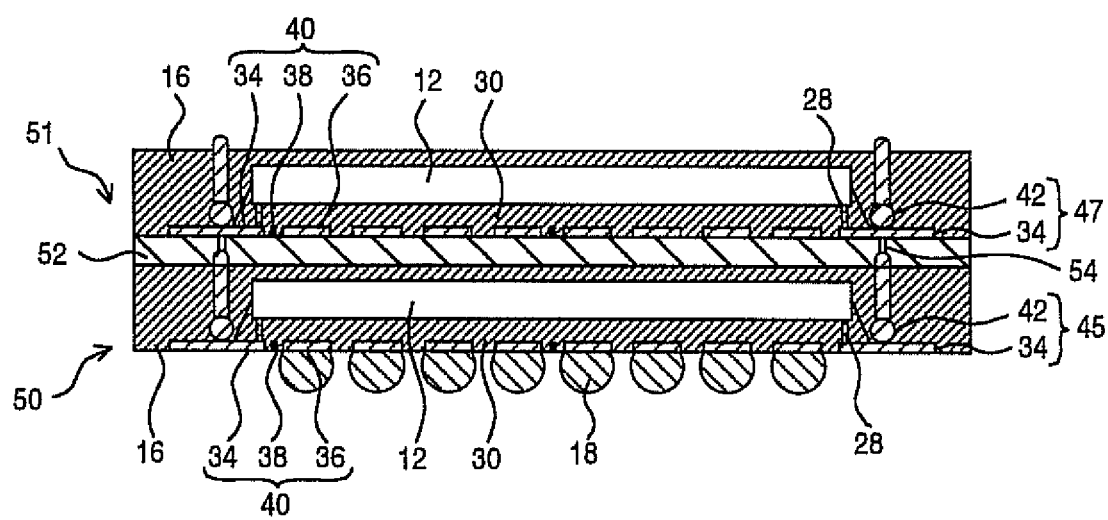
FIG. 11 is a sectional view showing a layered semiconductor structure according to a third embodiment.

A third embodiment is an example of the layered semiconductor devices according to the first embodiment. FIG. 11 is a sectional view of the layered semiconductor structure according to the third embodiment. Referring to FIG. 11, a stud bump 54 is provided on the upper surface of the first connection electrode 45 of the first semiconductor device 50 such that the protrusion amount of the first connection electrode 45 is increased. The first and the second semiconductor devices 50 and 51 are layered through the thermocompression bonding between the upper surface of the first connection electrode 45 with increased protrusion amount of the first semiconductor device 50 and the lower surface of the second connection electrode 47 of the second semiconductor device 51. The solder balls 18 are provided on the first semiconductor device 50, but not provided on the second semiconductor device 51. An adhesive agent 52 is applied between the first and the second semiconductor devices 50 and 51 for ensuring the bonding strength. The layered semiconductor structure according to the third embodiment, thus, is produced.

In the third embodiment, as the stud bump 54 is provided on the upper surface of the first connection electrode 45 of the first semiconductor device 50, the resultant protrusion amount is increased. This makes it possible to electrically couple the first and the second semiconductor devices 50 and 51 more easily and stably compared with the second embodiment.

The third embodiment shows the structure in which the stud bump 54 is provided on the upper surface of the first connection electrode 45 of the first semiconductor device 50. The stud bump 54 may be provided on the lower surface of the second connection electrode 47 of the second semiconductor electrode 51 to provide the same effects as those achieved in the third embodiment.

Figure 12:
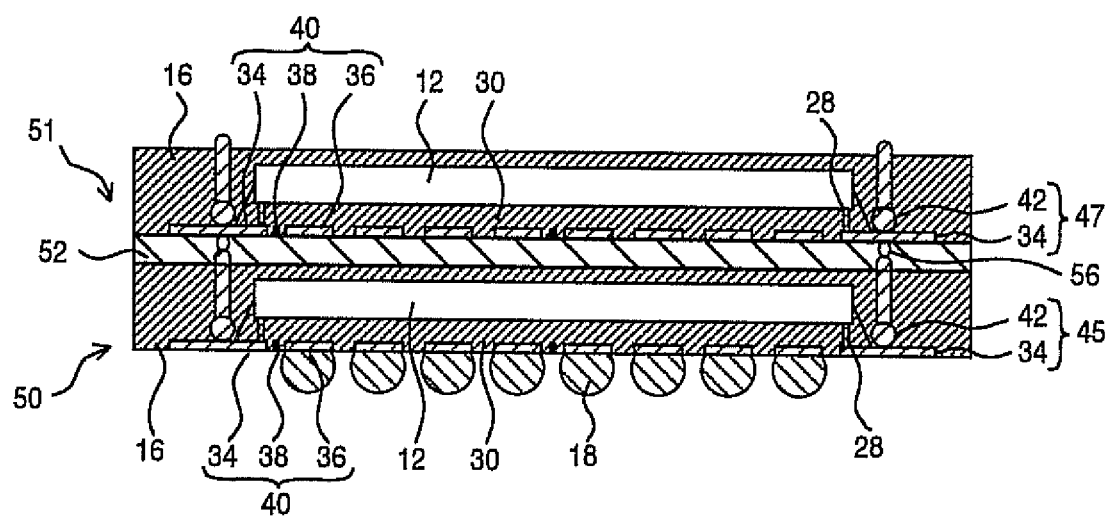
FIG. 12 is a sectional view showing a layered semiconductor structure according to a fourth embodiment.

A fourth embodiment is an example of the layered semiconductor devices according to the first embodiment. FIG. 12 is a sectional view showing the layered semiconductor structure according to the fourth embodiment. Referring to FIG. 12, the upper surface of the first connection electrode 45 of the first semiconductor device 50 is bonded with the lower surface of the second connection electrode 47 of the second semiconductor device 51 with a solder 56 that is a eutectic solder or a lead free solder such that the first and the second semiconductor devices 50 and 51 are layered. The solder ball 18 is provided on the first semiconductor device 50, but not provided on the second semiconductor device 51. An adhesive agent 52 is applied between the first and the second semiconductor devices 50 and 51 for ensuring the bonding strength. Thus, the layered semiconductor structure according to the fourth embodiment is produced.

In the fourth embodiment, the first and the second semiconductor devices 50 and 51 are layered using the solder 56 so as to provide bonding stronger than those in the second and the third embodiments where the first and the second semiconductor devices 50 and 51 are layered through the thermocompression bonding.

Figure 13:
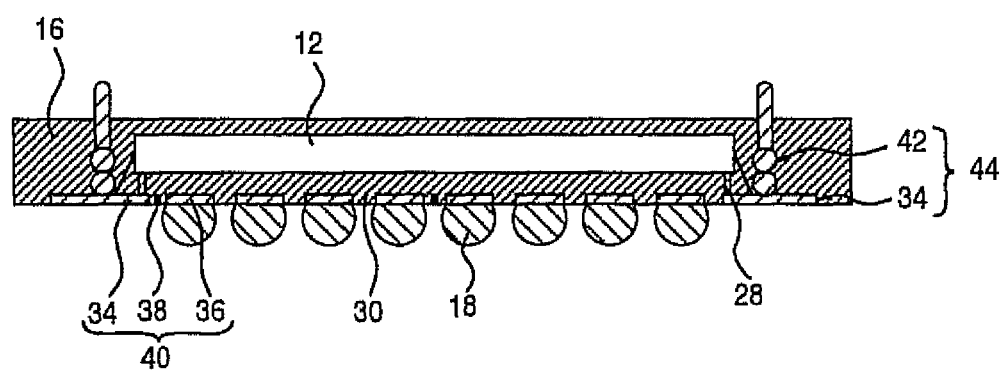
FIG. 13 is a sectional view showing a semiconductor device according to a fifth embodiment.

A fifth embodiment is an example of the semiconductor device with a through electrode 42 having two or more stud bumps layered. FIG. 13 is a sectional view of the semiconductor device according to the fifth embodiment. Referring to FIG. 13, a process of forming the stud bump is performed a plurality of times such that the connection electrode 44 having the through electrode 42 layered on the upper surface of the first land electrode 34 is formed. Any other structure is the same as that shown in FIG. 3.

The height of the through electrode 42 may be controlled in accordance with the material and thickness of the gold wire used for the stud bump. If the thickness of the gold wire is increased to ensure the height of the through electrode 42, the diameter of the through electrode 42 is also increased. This may deteriorate the advantage derived from the formation of the through electrode 42 with the stud bump that the electrode pitch of the connection electrode 44 can be made narrow. In the fifth embodiment, the process step of forming the stud bump using the thin gold wire is executed a plurality of times so as to form the through electrode 42 with sufficient height without increasing the diameter of the through electrode 42. This makes it possible to form the connection electrode 44 with sufficient height while keeping the electrode pitch of the connection electrode 44 narrow. The layered semiconductor structure according to the fifth embodiment allows the electric coupling between the upper and the lower semiconductor devices mode with relative ease and stability compared with the layered semiconductor devices according to the first embodiment.

In the second to the fourth embodiments, it is preferable to apply the adhesive agent 52 before bonding the first connection electrode 45 of the first semiconductor device 50 and the second connection electrode 47 of the second semiconductor device 51 so as to fix the applied state of the adhesive agent 52. Also, it is preferable to form the solder ball 18 on the first semiconductor device 50 after the process of bonding the first and the second connection electrodes 45 and 47 so as to simplify the process of bonding the first connection electrode 45 of the first semiconductor device 50 and the second connection electrode 47 of the second semiconductor device 51 and to prevent formation of the solder ball 18 onto the defective semiconductor device.

In the second to the fourth embodiments, examples of how the semiconductor devices according to the first embodiment are layered are described. When the semiconductor devices according to the fifth embodiment are layered as in the second to the fourth embodiments, the same effects as those derived from the embodiments may be obtained.

The second to the fourth embodiments show the examples of layering the semiconductor devices through the thermocompression bonding or the use of solder. However, it is not limited to these methods, but the method using the ultrasonic wave and the like may be employed.

Figure 14:
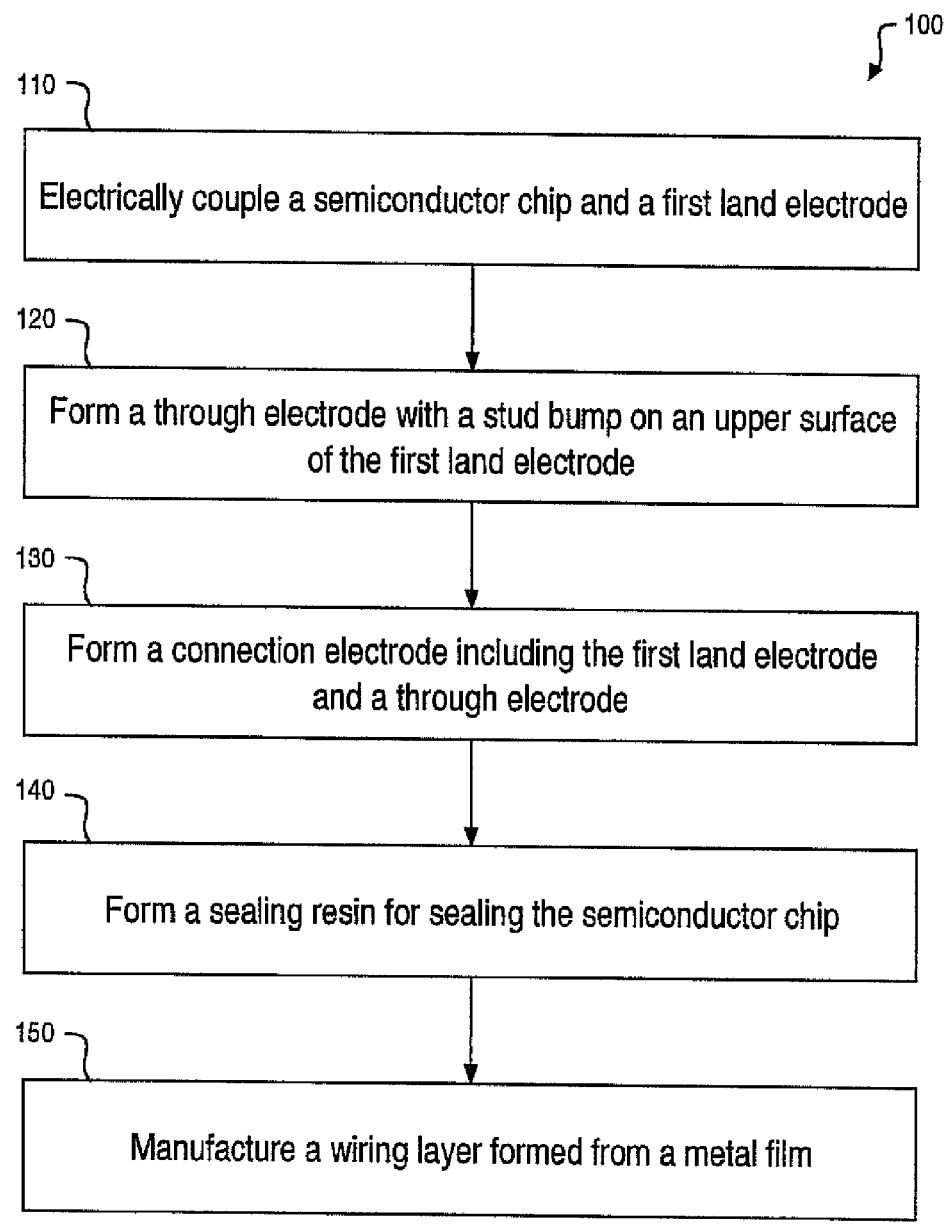
FIG. 14 illustrates a flowchart for the process of manufacturing a semiconductor device in accordance with various embodiments of the invention.

FIG. 14 illustrates a flowchart 100 for the process of manufacturing a semiconductor device in accordance with various embodiments of the invention. At block 110, a first land electrode 34 is electrically coupled to a semiconductor chip 12. The electrical coupling may be accomplished, for example, including face-down packaging of the semiconductor chip. At block 120, a through electrode 42 is formed on an upper surface of the first land electrode 34 using a stud bump 28, this may include, for example, forming a plurality of stud bumps 28. At block 130, a connection electrode 42 is formed from the first land electrode 34 and the through electrode 42.

At block 140, a sealing resin 16 through which the connection electrode 42 passes is formed for sealing the semiconductor chip 12. Forming the sealing resin may be accomplished by covering an upper portion of the connection electrode 42 with a sheet of molding such that an upper surface of the connection electrode 42 is formed that is higher than an upper surface of the sealing resin 16. Then, a wiring layer 40 is manufactured from a metal film at block 150. The wiring layer 40 may be formed by etching a metal film applied to a tape substrate, for example.

Figure 15:
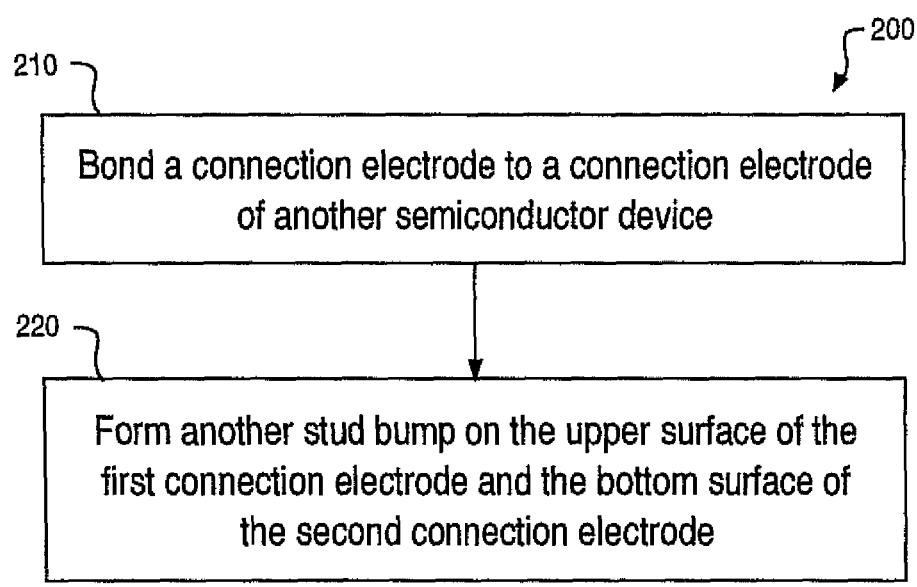
FIG. 15 illustrates a flowchart for the process of manufacturing a layered semiconductor structure in accordance with various embodiments of the invention.

FIG. 15 illustrates a flowchart 200 for the process of manufacturing a layered semiconductor structure in accordance with various embodiments of the invention. At block 210, a first semiconductor device 50 is bonded to a second semiconductor device 51 by bonding the upper surface of a first connection electrode 45 of the first semiconductor device 50 to the lower surface of a second connection electrode 47 of the second semiconductor device 51. Bonding the upper surface of the first connection electrode 45 to the lower surface of the second connection electrode 47 is accomplished through thermocompression or soldering, according to embodiments of the present invention. Then another stud bump 28 is formed at one of the positions along an upper surface of the first connection electrode 45 and a lower surface of the second connection electrode 47 at block 220

Embodiments generally relate to semiconductor devices. More particularly, embodiments relate to a semiconductor device used for multiple semiconductor device layering and a method for manufacturing the same. In one implementation, the various embodiments are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells," each of which traditionally stores one bit of information. However, newer flash memory devices can store more than 1 bit per cell. These newer flash memory devices double the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, the newer flash memory devices have several key advantages, such as being capable of burst-mode access as fast as 80 MHz, page access times as fast as 25 ns, simultaneous read-write operation for combined code and data storage, and low standby power (e.g., 1 µA).

Figure 16:
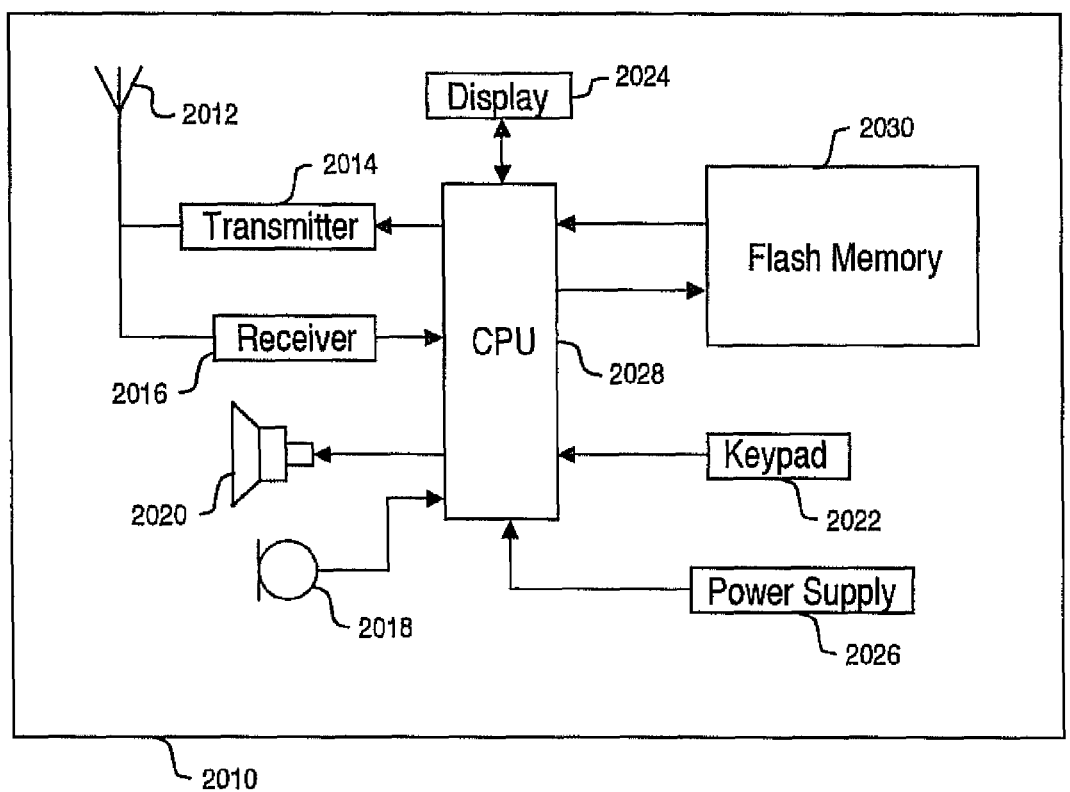
FIG. 16 illustrates a block diagram of an exemplary portable phone, upon which various embodiments of the invention may be implemented.

FIG. 16 shows a block diagram of an exemplary portable telephone 2010 (e.g., cell phone, cellular phone, mobile phone, internet protocol phone, wireless phone, etc.), upon which various embodiments of the invention can be implemented. The cell phone 2010 includes an antenna 2012 coupled to a transmitter 2014 and a receiver 2016, as well as a microphone 2018, a speaker 2020, a keypad 2022, and a display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. In the present embodiment, Flash memory 2030 may include a semiconductor chip; a connection electrode including a first land electrode electrically coupled with the semiconductor chip, and a through electrode formed on an upper surface of the first land electrode to be electrically coupled with the first land electrode using at least one stud bump; and a sealing resin, through which the connection electrode passes, for sealing the semiconductor chip. In various embodiments, the flash memory 2030 can be utilized with various devices, such as mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are coupled to the bit lines in a parallel configuration, while in a conventional NAND-type flash memory, the memory cell transistors are coupled to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, an improved flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

It is noted that the components (e.g., 2012, 2014, 2016, 2022, 2028, 2030, etc.) of portable telephone 2010 can be coupled to each other in a wide variety of ways. For example, in an embodiment, the antenna 2012 can be coupled to transmitter 2014 and receiver 2016. Additionally, the transmitter 2014, receiver 2016, speaker 2020, microphone 2018, power supply 2026, keypad 2022, flash memory 2030 and display 2024 can each be coupled to the processor (CPU) 2028. It is pointed out that in various embodiments, the components of portable telephone 2010 can be coupled to each other via, but are not limited to, one or more communication buses, one or more data buses, one or more wireless communication technologies, one or more wired communication technologies, or any combination thereof.

Figure 17:
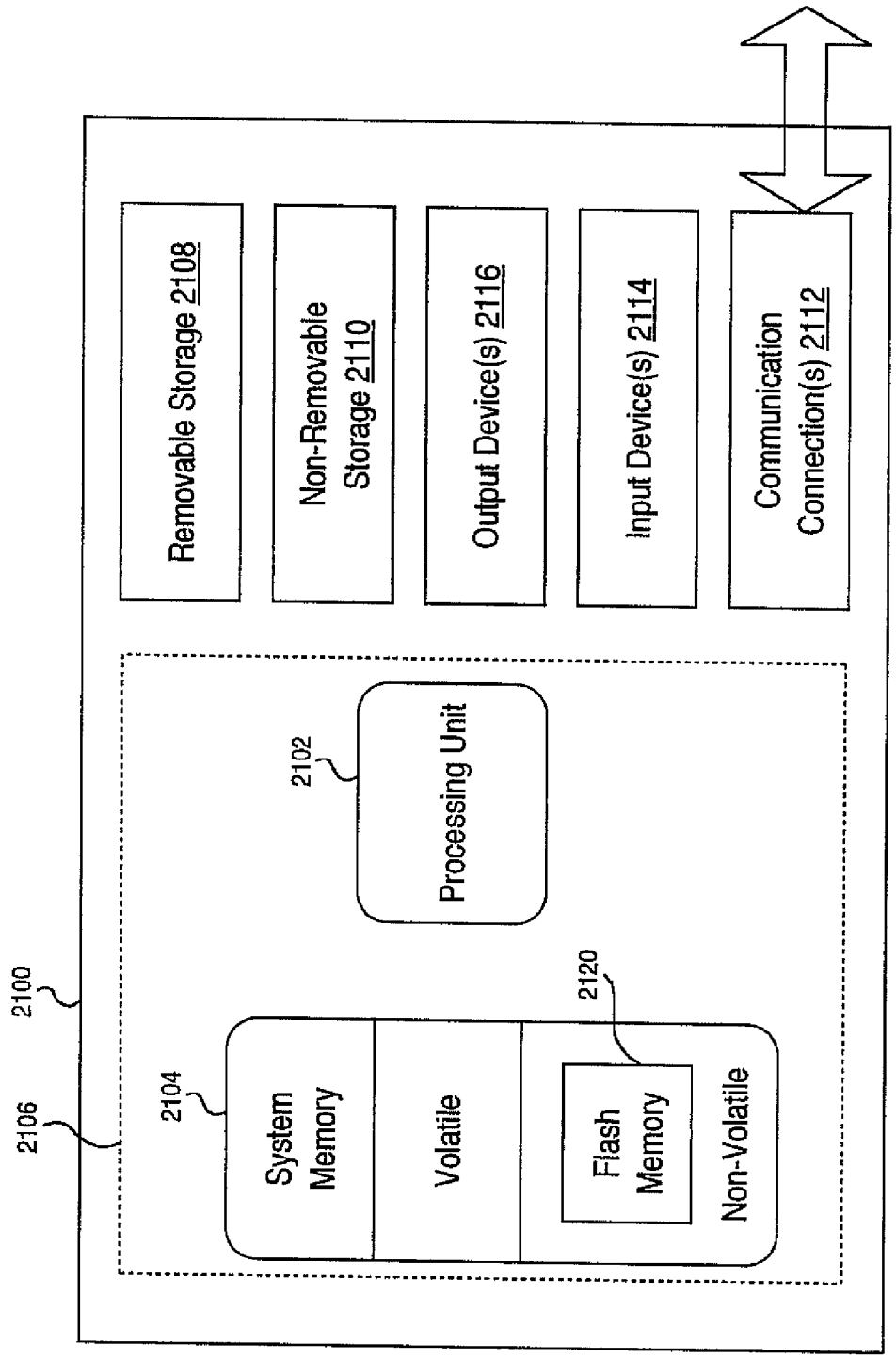
FIG. 17 illustrates a block diagram of an exemplary computing device, upon which various embodiments of the invention may be implemented.

FIG. 17 illustrates a block diagram of an exemplary computing device 2100, upon which various embodiments of the invention can be implemented. Although computing device 2100 is shown and described in FIG. 17 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. In an embodiment, computing device 2100 can include additional components not shown in FIG. 17.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

Computing device 2100 can include at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 17 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could be a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 17 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, Flash memory 2120 may include a semiconductor chip; a connection electrode including a first land electrode electrically coupled with the semiconductor chip, and a through electrode formed on an upper surface of the first land electrode to be electrically coupled with the first land electrode using at least one stud bump; and a sealing resin, through which the connection electrode passes, for sealing the semiconductor chip.

In various embodiments, the flash memory 2120 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes newer flash memory technology to allow storing of two physically distinct bits on opposite sides of a memory cell.

Device 2100 may also contain communications connection(s) or coupling(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection or coupling, and wireless media such as acoustic, radio frequency (RF), infrared and other wireless media. The term computer readable media as used herein includes both storage media and communication media.

It is noted that the components (e.g., 2102, 2104, 2110, 2120, etc.) of computing device 2100 can be coupled to each other in a wide variety of ways. For example in various embodiments, the components of computing device 2100 can be coupled to each other via, but are not limited to, one or more communication buses, one or more data buses, one or more wireless communication technologies, one or more wired communication technologies, or any combination thereof.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous.

Figure 18:
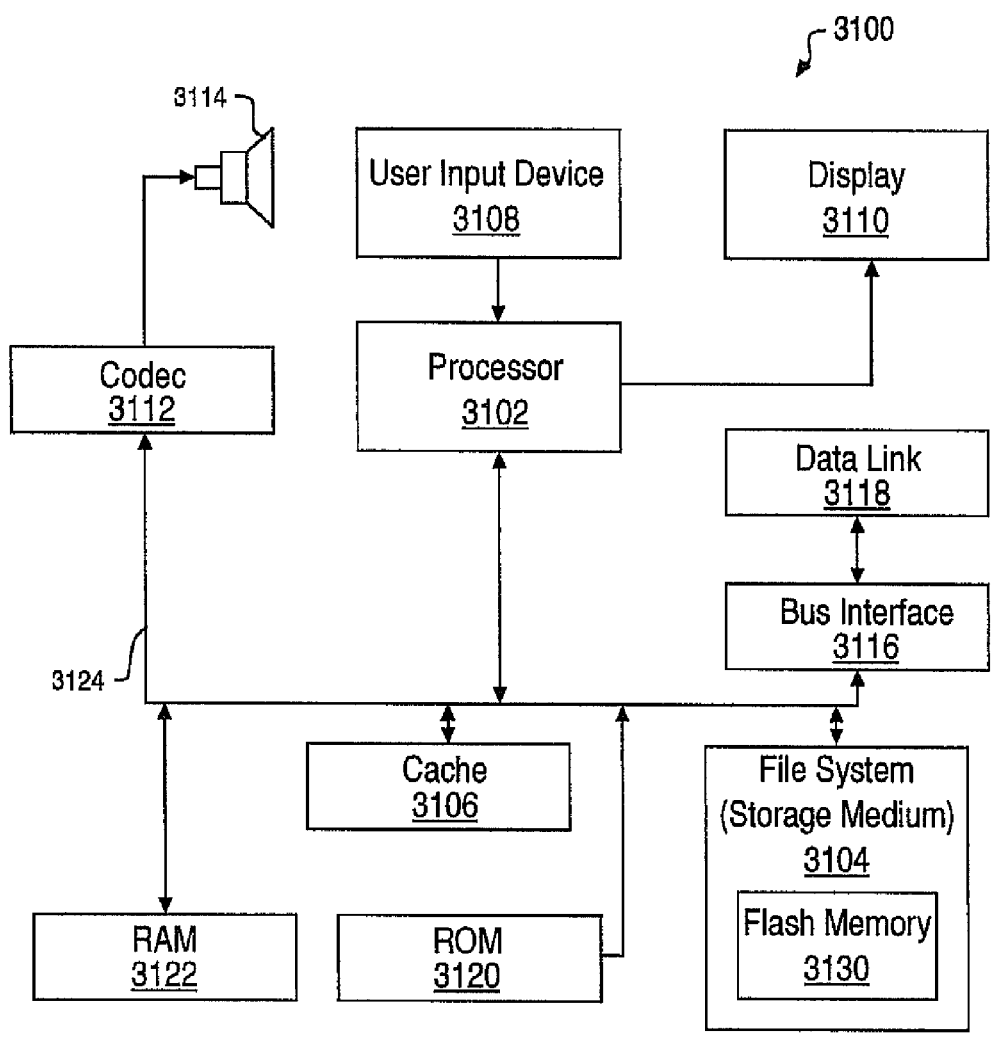
FIG. 18 illustrates an exemplary portable multimedia device, or media player, in accordance with various embodiments of the invention.

FIG. 18 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 includes flash memory 3130. In the present embodiment, Flash memory 3130 may include a semiconductor chip; a connection electrode including a first land electrode electrically coupled with the semiconductor chip, and a through electrode formed on an upper surface of the first land electrode to be electrically coupled with the first land electrode using at least one stud bump; and a sealing resin, through which the connection electrode passes, for sealing the semiconductor chip. In various embodiments, the flash memory 3130 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that couple to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

It is noted that the components (e.g., 3102, 3104, 3120, 3130, etc.) of media player 3100 can be coupled to each other in a wide variety of ways. For example, in an embodiment, the codec 3122, RAM 3122, ROM 3120, cache 3106, processor 3102, storage medium 3104, and bus interface 3116 can be coupled to data bus 3124. Furthermore, the data link 3118 can be coupled to the bus interface 3116. The user input device 3108 and the display 3110 can be coupled to the processor 3102 while the speaker 3114 can be coupled to the codec 3112. It is pointed out that in various embodiments, the components of media player 3100 can be coupled to each other via, but are not limited to, one or more communication buses, one or more data buses, one or more wireless communication technologies, one or more wired communication technologies, or any combination thereof.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

I claim:

1. A semiconductor device comprising:
a plurality of semiconductor structures, each of the plurality of semiconductor structures comprising:
   a semiconductor chip;
   a connection electrode including a first land electrode electrically coupled with the semiconductor chip, and a cylindrical through electrode formed on an upper surface of the first land electrode that is electrically coupled to the first land electrode using a plurality of stud bumps wherein the plurality of stud bumps is formed between the through electrode and the land electrode wherein the diameter of the stud bumps is greater than the diameter of the cylindrical through electrode at the point at which the stud bumps and the cylindrical through electrode make contact; and
   a sealing resin, through which the connection electrode passes, for sealing the semiconductor chip,
wherein the bottom surface of the land electrode is coplanar with the bottom surface of the sealing resin and wherein a top surface and portions of side surfaces of the through electrode extend above the top surface of the sealing resin.

2. The semiconductor device according to claim 1, wherein each of the plurality of semiconductor structures further comprises a second land electrode electrically coupled with the semiconductor chip, which is used for an external connection, wherein the connection electrode is provided around a periphery of the semiconductor chip, and the second land electrode is provided directly below the semiconductor chip.

3. The semiconductor device according to claim 1, wherein in each of the plurality of semiconductor structures, an upper surface of the connection electrode is positioned higher than an upper surface of the sealing resin.

4. The semiconductor device according to claim 1, wherein each of the plurality of semiconductor structures further comprises a wiring layer that is formed from a metal film and includes the first land electrode, the second land electrode and a wiring for electrically coupling the first and the second land electrodes.

5. The semiconductor device according to claim 1, wherein in each of the plurality of semiconductor structures, the through electrodes formed on the first land electrodes which are adjacent with each other are positioned at different positions in a longitudinal direction of the first land electrode.

6. The semiconductor device according to claim 1, wherein in each of the plurality of semiconductor structures, the wiring layer is positioned below a lower surface of the semiconductor chip which is positioned through a face-down packaging.

7. The semiconductor device according to claim 1, wherein an adhesive agent bonds the first semiconductor structure to the second semiconductor structure vertically.

8. The semiconductor device according to claim 1, wherein the first semiconductor structure and the second semiconductor structure are layered by bonding a first connection electrode of the first semiconductor device to a second connection electrode of the second semiconductor device.

9. The semiconductor device according to claim 8, wherein another stud bump is formed between an upper surface of the first connection electrode and a lower surface of the second connection electrode.

10. The semiconductor device according to claim 8, wherein the first and the second connection electrodes are bonded through thermocompression or soldering.

11. A system, comprising:
a processor;
a cache;
a user input component; and
a flash memory comprising:
a plurality of semiconductor structures, each of the plurality of semiconductor structures comprising:
a semiconductor chip;
a connection electrode including a first land electrode electrically coupled with the semiconductor chip, and a cylindrical through electrode formed on an upper surface of the first land electrode that is electrically coupled to the first land electrode using a plurality of stud bumps wherein the stud bump is formed between the through electrode and the land electrode wherein the diameter of the stud bumps is greater than the diameter of the cylindrical through electrode at the point at which the stud bumps and the through electrode make contact; and
a sealing resin, through which the connection electrode passes, for sealing the semiconductor chip, wherein the bottom surface of the land electrode is coplanar with the bottom surface of the sealing resin and wherein a top surface and portions of side surfaces of the through electrode extend above the top surface of the sealing resin.

12. The system as recited in claim 11 wherein the system is a portable media player.

13. The system as recited in claim 11 wherein the system is a cellular telephone.

14. The system as recited in claim 11 wherein the system is a computing device.

15. The system according to claim 11, wherein an adhesive agent bonds the first semiconductor structure to the second semiconductor structure vertically.

\* \* \* \* \*